United States Patent [19]

Kitagawa et al.

[11] Patent Number: 5,420,817

[45] Date of Patent: May 30, 1995

[54] SEMICONDUCTOR INTEGRATED CIRCUIT DEVICE COMPRISING MEMORY AREA IN WHICH STRUCTURALLY DIFFERENT MEMORY CELLS ARE INCLUDED

[75] Inventors: Nobutaka Kitagawa, Kawasaki; Shigeharu Nakata, Yokohama; Yasuhiro Ishii, Kawasaki; Masue Shiba, Tokyo, all of Japan

[73] Assignee: Kabushiki Kaisha Toshiba, Kawasaki, Japan

[21] Appl. No.: 167,152

[22] Filed: Dec. 16, 1993

[30] Foreign Application Priority Data

Dec. 18, 1992 [JP] Japan .................................. 4-339078

[51] Int. Cl.⁶ .............................................. G11C 17/00
[52] U.S. Cl. ....................................... 365/96; 365/94; 365/201; 365/226; 365/52
[58] Field of Search ................. 365/94, 96, 201, 226, 365/52

[56] References Cited

U.S. PATENT DOCUMENTS 4,419,747 12/1983 Jordan ................... 365/201
4,451,903 5/1984 Jordan ................... 365/94
4,811,303 3/1989 Hirai .................... 365/94

FOREIGN PATENT DOCUMENTS 1-263992 10/1989 Japan .
3-9549 1/1991 Japan .

Primary Examiner—Joseph A. Popek
Assistant Examiner—F. Niranjan
Attorney, Agent, or Firm—Finnegan, Henderson, Farabow, Garrett & Dunner

[57] ABSTRACT

The same bit lines are used in common to a fixed data cell array and a memory cell array. The output section of the fixed data cell array is connected to an output circuit, just like the output section of the memory cell array. In response to signal CON supplied from a computer, an array selector examines the states of the arrays and performs switching between the state where one of the arrays can be selected and the state where neither of them can be selected. In the case where an externally-programmable memory, such as an EPROM, is employed, a write control circuit operates with respect only to the memory cell array, and prohibits data from being written in the fixed data cell array. The fixed data cell array is pre-programmed as a nonvolatile memory by programming means different from that used for programming the cells of the memory cell array.

5 Claims, 5 Drawing Sheets

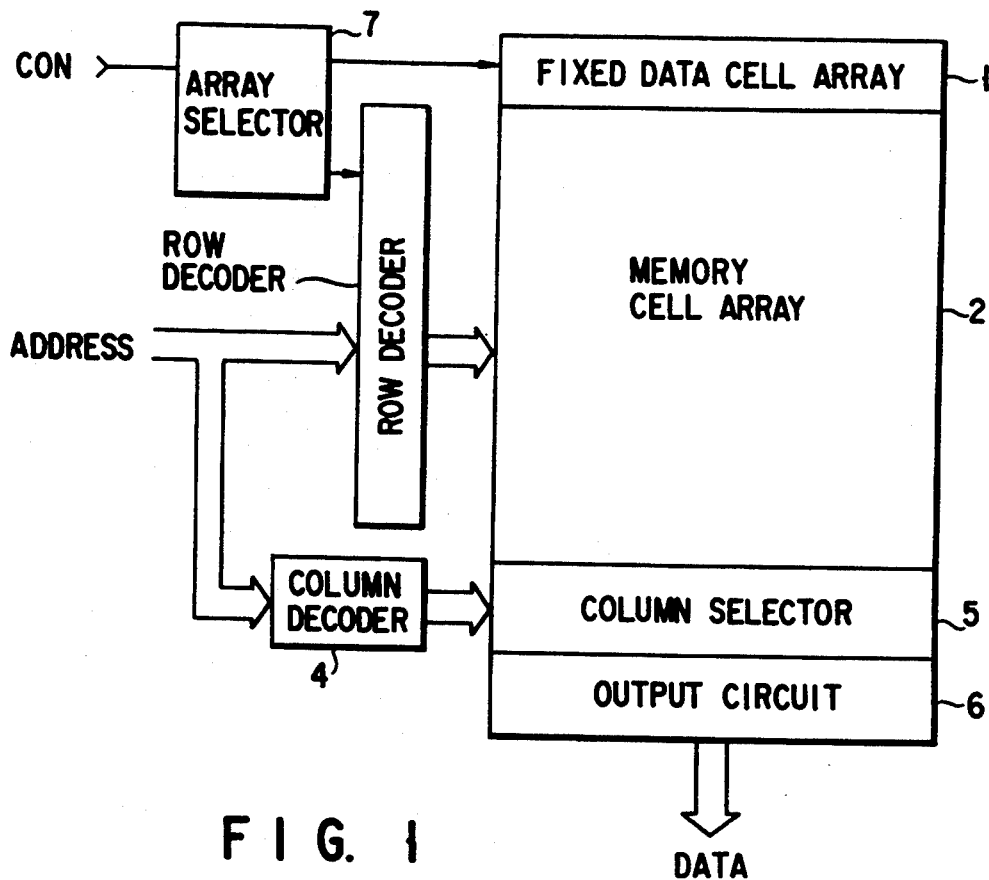
F I G. 1
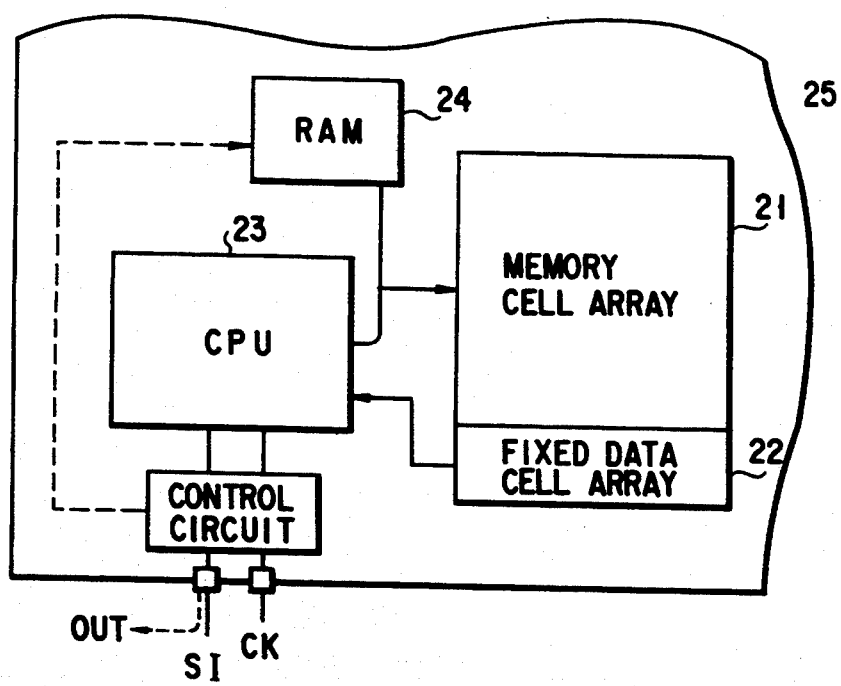
F I G. 7

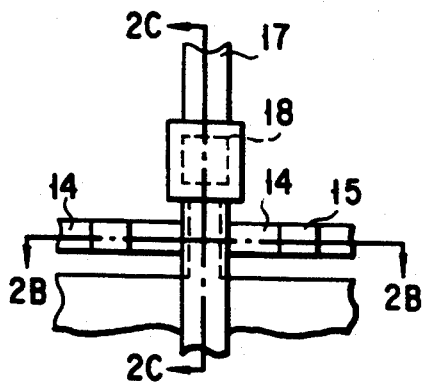
F I G. 2A
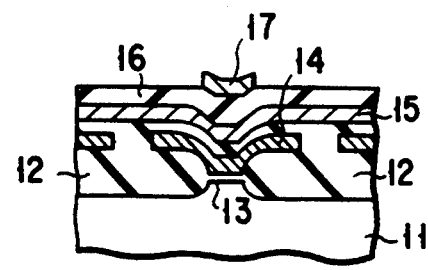
F I G. 2B
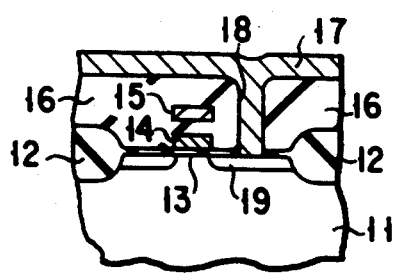
F I G. 2C
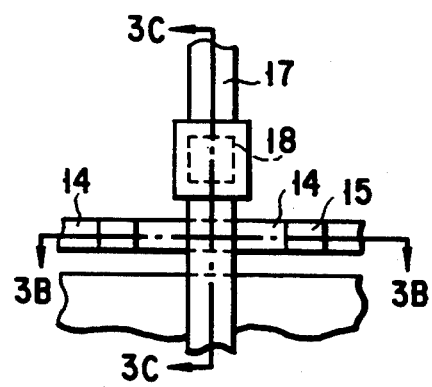
F I G. 3A
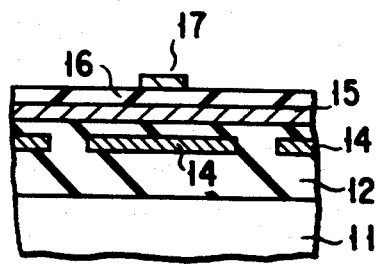
F I G. 3B
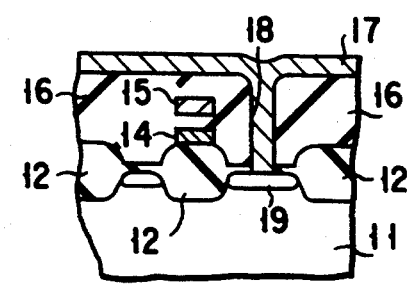
F I G. 3C

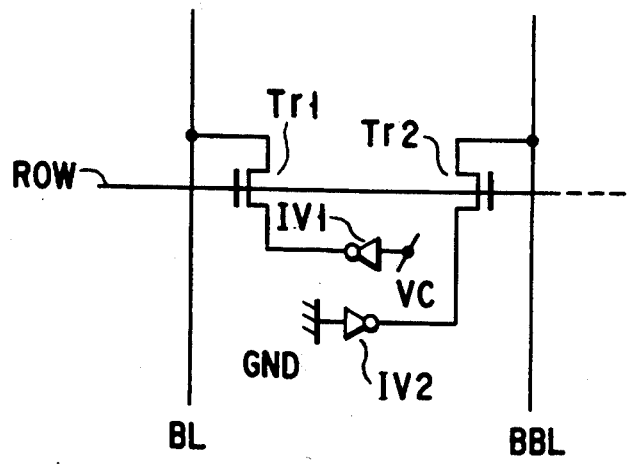
F I G. 6A
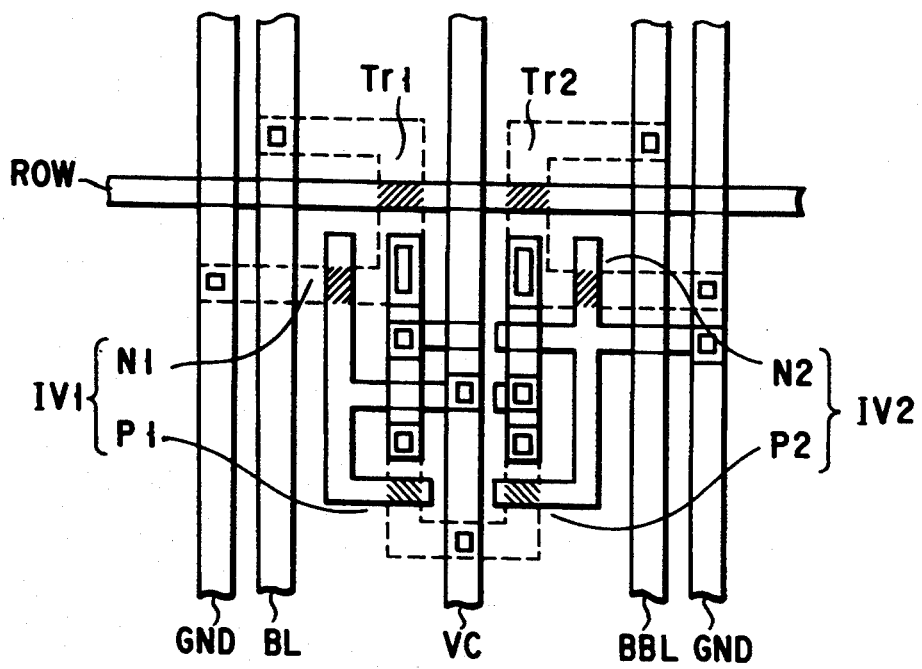
F I G. 6B

SEMICONDUCTOR INTEGRATED CIRCUIT DEVICE COMPRISING MEMORY AREA IN WHICH STRUCTURALLY DIFFERENT MEMORY CELLS ARE INCLUDED

BACKGROUND OF THE INVENTION

1. Field of the Invention

The present invention relates to a semiconductor integrated circuit device wherein fixed data is stored beforehand.

2. Description of the Related Art

Among the conventional semiconductor integrated devices for microcomputers, there is a type which stores a fixed program beforehand. The fixed program contains instruction codes which fetches external program data during the initial operation performed immediately after the power supply is turned on. The memory area for storing the fixed program is provided on the same semiconductor substrate as ordinary memory areas (e.g., a RAM, a ROM, an EPROM and an EEPROM), but it is constituted by an exclusive-use nonvolatile memory provided independently of the other memory areas.

Among the conventional semiconductor integrated devices for microcomputers, there is also known a type which permits signatures (such as information on a manufacturer, a device, etc.) to be read out and output to an external device in response to entry of a specific code. Examples of such a device are the EPROM integrated circuit devices disclosed in U.S. Pat. Nos. 4,419,747 and 4,451,903. In this type of semiconductor integrated devices, a memory area in which the fixed data is programmed is located adjacent to an externally-programmable memory area.

In the former type of device, since the memory area for storing the fixed program is provided independently of the other memory areas, a cell area, a decoder circuit area, an input/output circuit area, etc. must be additionally provided for that memory area. Even when the memory area does not have a large storage capacity in comparison with the storage capacities of the other memory areas, the installation area required for the memory area is very wide, resulting in an increase in the manufacturing cost of the entire device.

In the former type of device, the memory area for storing the fixed program is provided independently of the other memory areas, although it can be realized by the same circuitry as the other memory areas. Therefore, the device is redundant in system configuration. In addition, the operation speed of the memory area for storing the fixed program inevitably differs from that of the other memory areas.

In the latter type of device, the externally programmable memory area is located adjacent to the fixed program memory area. Even in this case, performance such as the operating speed greatly varies, depending upon the circuit pattern employed.

The programmable memory area adjacent to the fixed program memory area can be realized by either a volatile type or a nonvolatile type. In practice, however, the programmable memory area is made by a nonvolatile memory, such as an EPROM, and the use of the fixed program memory area is limited to a particular purpose, such as the storage of signatures. Although fixed data can be written by external operation, the data stored beforehand may be damaged or undesirably altered due to an erroneous operation.

As can be understood from the above, in the conventional devices, the fixed program to be executed immediately after the power supply is turned on must be stored in a memory area provided independently of the other memory areas. Thus, a cell area, a decoder circuit area and an input/output circuit area are additionally required only for the fixed program memory area. Even when these memory area does not have a large storage capacity in comparison with the storage capacities of the ordinary memory areas, the installation area required is very wide, resulting in an increase in the manufacturing cost of the device.

SUMMARY OF THE INVENTION

Accordingly, an object of the present invention is to provide a semiconductor integrated circuit device comprising a memory area which requires only a minimum installation area and which can store fixed data without adversely affecting operations of the other memory areas.

To achieve this object, the present invention provides a semiconductor integrated circuit device comprising:

memory cell array means in which a plurality of memory cells are arranged;

nonvolatile program means located in the memory cell array means, the nonvolatile program means being obtained by modifying part of a memory cell structure of the memory cell array means, and incapable of being programmed by electric control;

peripheral memory circuit means used in common to both the memory cell array means and the nonvolatile program means; and selector means for selecting and accessing one of the memory cell array means and the nonvolatile programing means in response to reception of a predetermined signal.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block circuit diagram showing one embodiment of the present invention;

FIG. 2A is a plan view showing the pattern of a fixed data cell to which an EPROM according to the present invention is applied and which stores first data;

FIG. 2B is a sectional view taken along line 2B—2B in FIG. 2A;

FIG. 2C is a sectional view taken along line 2C—2C in FIG. 2A;

FIG. 3A is a plan view showing the pattern of a fixed data cell to which an EPROM according to the present invention is applied and which stores second data;

FIG. 3B is a sectional view taken along line 3B—3B in FIG. 3A;

FIG. 3C is a sectional view taken along line 3C—3C in FIG. 3A;

FIG. 6A is a circuit diagram showing a fixed data cell which utilizes a RAM cell according to the present invention and which stores second data;

FIG. 6B is a plan view showing the pattern of the structure depicted in FIG. 6A; and FIG. 7 is a block circuit diagram illustrating a case where the present invention is applied to a microcomputer integrated circuit device.

DETAILED DESCRIPTION OF THE PREFERRED EMBODIMENTS

Figure 4A:
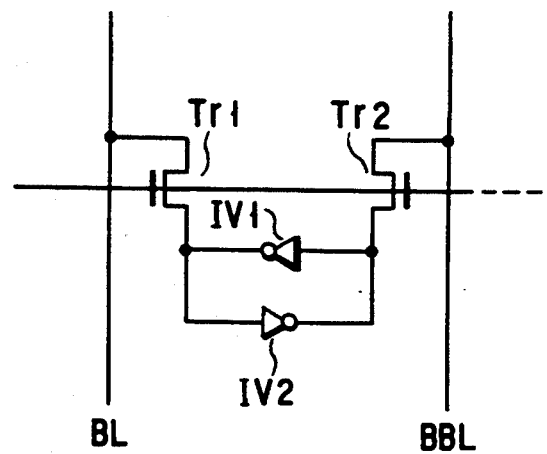
FIG. 4A is a circuit diagram showing how the structure of one RAM cell is when a random access memory is employed as a programmable memory cell in the present invention.

FIG. 1 is a block circuit diagram showing one embodiment of the present invention. Referring to FIG. 1, a fixed data cell array 1 (i.e., a memory cell area for storing a fixed program) is located adjacent to a memory cell array 2 (i.e., a programmable memory cell area). When an address is input, a row decoder 3, a column decoder 4 and a column selector 5 are used for reading or writing data with respect to the memory cells of the memory cell array 2 and for reading data from the memory cells of the fixed data cell array 1. The same bit lines are used in common to the fixed data cell array 1 and the memory cell array 2, and the output section of the fixed data cell array 1 is connected to an output circuit 6, just like the output section of the memory cell array 2. In response to signal CON supplied from a computer, an array selector 7 examines the states of the arrays 1 and 2 and performs switching between the state where one of the arrays 1 and 2 can be selected and the state where neither of them can be selected. In the case where an externally-programmable memory, such as an EPROM, is employed, a write control circuit (not shown) operates with respect only to the memory cell array 2 and prohibits data from being written in the fixed data cell array 1.

The fixed data cell array 1 stores fixed program data by means of a nonvolatile cell structure which is different from the cell structure of the memory cell array 2. The memory cell array 2 will be described, referring to the case where it is made by an erasable and programmable ROM (EPROM).

FIGS. 2A and 3A are plan views each showing the pattern of a fixed data cell made by an EPROM. FIG. 2A depicts a "1" fixed data cell which stores "1" data, while FIG. 3A depicts a "0" fixed data cell which stores "0" data. FIGS. 2B and 2C are sectional views taken along lines 2B—2B and 2C—2C in FIG. 2A, respectively, and FIGS. 3B and 3C are sectional views taken along lines 3B—3B and 3C—3C in FIG. 3A, respectively.

In general, an EPROM retains externally-written "0" data in the OFF state, with electrons accumulated in a first polysilicon layer (which is generally referred to as a floating gate). The EPROM retains externally written "1" data in the ON state, without any electron accumulated in the first polysilicon layer. The "1" fixed data cell shown in FIGS. 2A—2C is similar in configuration to a normally-used programmable EPROM cell. Referring to FIGS. 2B and 2C, a first polysilicon layer 14 (i.e., a floating gate) is formed on a gate oxide film 13, which is surrounded by a field oxide film 12 formed on a semiconductor substrate 11. A second polysilicon layer 15 (i.e., a word line) is formed above the first polysilicon layer 14, with a gate oxide film interposed. An interlayer insulation film 16 is formed on the second polysilicon layer 15, and a bit line 17 is formed on the interlayer insulation film 16. The bit line 17 is connected to a drain diffusion region 19 formed in the surface region of the substrate 11 by way of a contact hole 18.

The "1" fixed data cell mentioned above is connected to the array selector 7 shown in FIG. 1, so as to prevent the second polysilicon layer 15 (i.e., the word line) from becoming high in potential. Since no data can be written in the "1" fixed data cell, this data cell can retain data "1" at all times.

The "0" fixed data cell shown in FIGS. 3A-3C differs in configuration from the "1" fixed data cell described above, in that the gate insulation film 13 is not formed. As is shown in FIG. 3B, the field oxide film 12 has a constant thickness. Since no transistor is formed in this structure, no data can be written in the "0" fixed data cell. In addition, since the bit line is not connected to a ground-potential region, data can be read out from the "0" fixed data cell, as in the case of an ordinary OFF-state EPROM cell into which data "0" has been programmed.

The data programmed in an ordinary EPROM cell by ultraviolet ray irradiation can be cleared to "1", but the data programmed in the above-mentioned fixed data cell cannot be cleared by ultraviolet ray irradiation since the data are retained by the structure. As in the ordinary programmable EPROM, the bit lines 17 are connected to the output section (i.e., the drain diffusion region 19) by way of the contact holes 18, each bit line has uniform storage capacity. This structure is effective in attaining a high operation speed, in comparison with the case where the fixed data cell employs contact elements.

In the configuration of the above embodiment, the memory cell area for storing fixed data is located adjacent to a programmable memory cell area. Therefore, a decoder, a reading circuit, etc. can be used in common to the two memory cell areas, and the element installation area can be as narrow as possible. Since the two memory cell areas are controlled by the array selector 7 such that data are not simultaneously read out therefrom, each structural element can operate reliably. In addition, since the output sections of the memory cells for storing fixed data and the output sections of the programmable memory cells are connected to the same bit lines, each bit line has uniform storage capacity, and the operation speed is not adversely affected. Since the memory cell for storing fixed data retains data in a nonvolatile manner by means of a structure different from that of the ordinary programmable memory cell, the fixed data stored in that memory cell is not adversely affected by an external programming operation or an external data erasure operation. The fixed data memory cell retains the fixed data in a satisfactory manner and reliably serves as a nonvolatile memory used exclusively for reading out data.

Figure 4B:
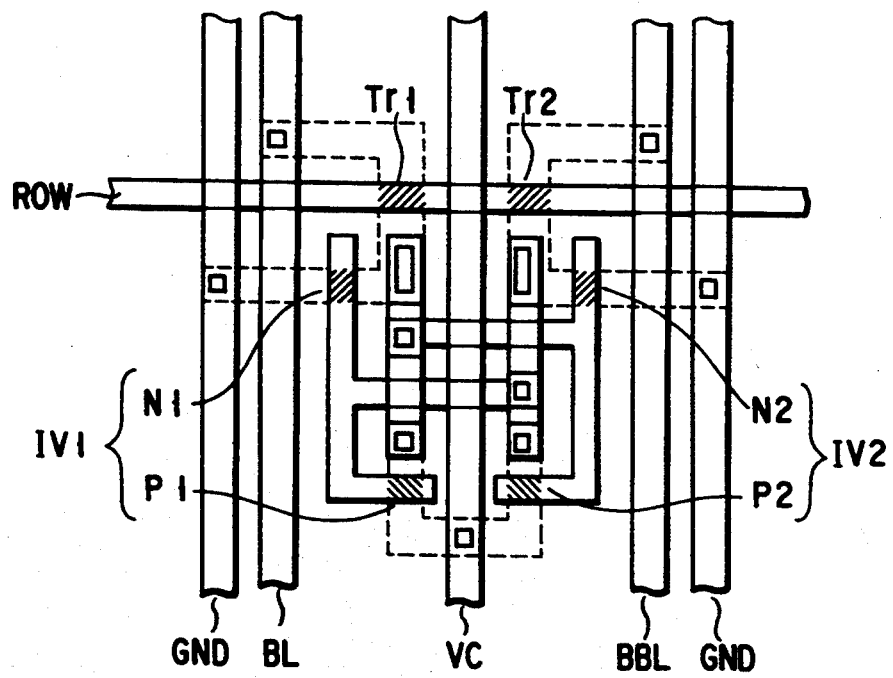
FIG. 4B is a plan view showing the pattern of the structure depicted in FIG. 4A.

FIG. 4A is a circuit diagram showing one RAM cell employing a random access memory (a RAM cell) as a programmable memory cell (the memory cell array 2 shown in FIG. 1), and FIG. 4B is a plan view showing the pattern of the structure depicted in FIG. 4A. FIGS. 5A, 5B, 6A and 6B show examples of a fixed data cell array (indicated by "1" in FIG. 1) located adjacent to the RAM cell.

Referring to FIG. 4A, transfer transistors Tr1 and Tr2 have their gates connected to a row selection line ROW. The current paths of transfer transistors Tr1 and Tr2 are connected at one end to complementary bit lines BL and BBL, and are connected at the other end to input/output terminals of inverters IV1 and IV2, thus forming a flip-flop.

The structure depicted in FIG. 4A will be detailed with reference to FIG. 4B. Inverter IV1 is a CMOS inverter made up of a p-channel MOS transistor P1 and an n-channel MOS transistor N1; likewise, inverter IV2 is a CMOS inverter made up of a p-channel MOS transistor P2 and an n-channel MOS transistor N2. The broken lines in FIG. 4B indicate diffusion regions, and the oblique lines in FIG. 4B indicate channel regions where gate wiring layers cross the diffusion regions. In FIG. 4B, the contact sections are depicted as having quadrilateral shapes (including square shapes and rectangular shapes). The sources of the p-channel MOS transistors P1 and P2 are connected to a power supply line VC, and the sources of the n-channel MOS transistors N1 and N2 are connected to a grounding line GND.

Figure 5A:
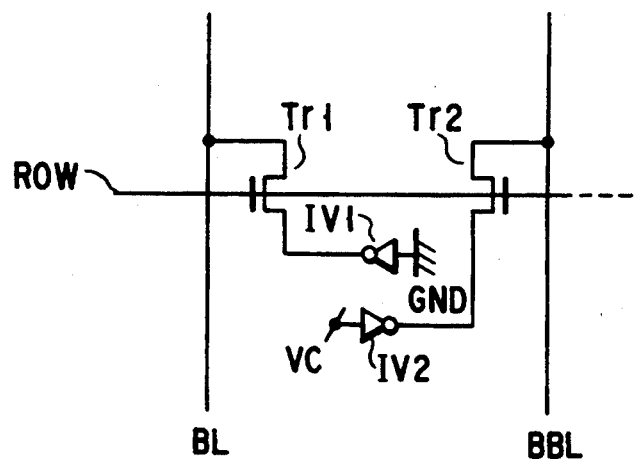
FIG. 5A is a circuit diagram showing a fixed data cell which utilizes a RAM cell according to the present invention and which stores first data.
Figure 5B:
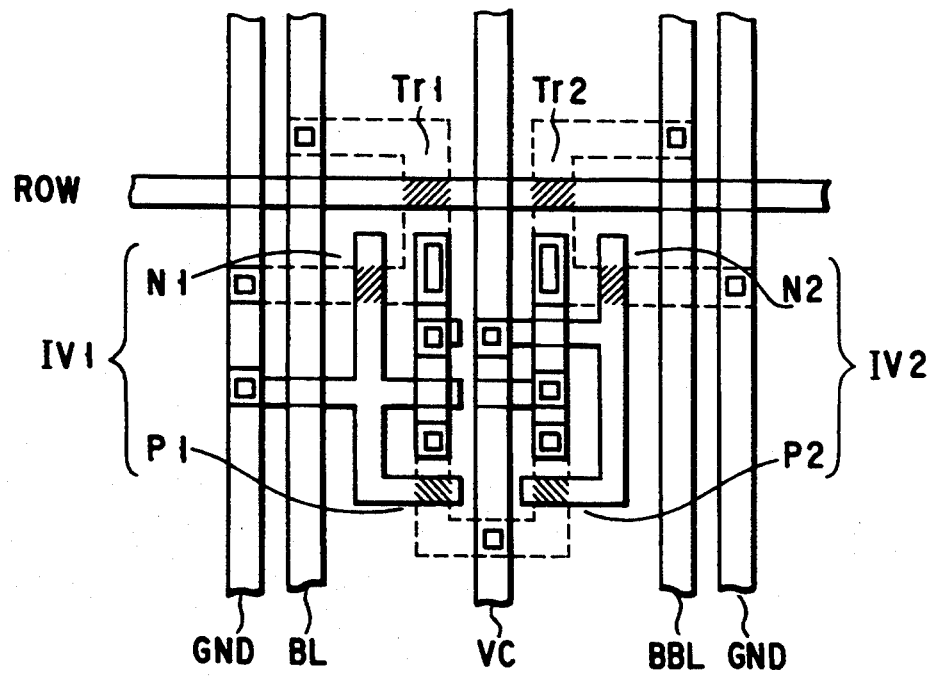
FIG. 5B is a plan view showing the pattern of the structure depicted in FIG. 5A.

FIG. 5A is a circuit diagram showing a "1" fixed data cell of the fixed data cell array, and FIG. 5B is a plan view showing the pattern of the structure depicted in FIG. 5A. The structure shown in FIGS. 5A and 5B differs from that shown in FIGS. 4A and 4B, in that the input terminal of inverter IV1 is grounded, while the input terminal of inverter IV2 is connected to the power supply (VC).

FIG. 6A is a circuit diagram showing a "0" fixed data cell of the fixed data cell array, and FIG. 6B is a plan view showing the pattern of the structure depicted in FIG. 6A. The structure shown in FIGS. 6A and 6B differs from that shown in FIGS. 5A and 5B, in that the input terminal of inverter IV1 is connected to the power supply (VC), while the input terminal of inverter IV2 is grounded.

In the case where the fixed data cell is made by a RAM in the manner mentioned above, the wiring lines inside the cell are connected in a different manner from the wiring lines inside an ordinary RAM cell, so as to permit fixed data to be read out from the fixed data cell. Needless to say, other fixed data cannot be written the fixed data cell. Since the fixed data cell retains fixed data by the internal wirings without depending upon the power supply voltage, it serves as a nonvolatile memory. In addition, since the cell data output circuit and the inverter output circuit inside the cell are connected in a similar manner to the case of the ordinary RAM cell, the load applied to the bit lines is constant irrespective of the storage state of the fixed data cell, and therefore does not adversely affect the operation speed.

According to the embodiment circuits described above, it is possible to fabricate a memory cell array which is capable of storing fixed program data without the fixed program data being erased or altered by an external electric operation and which ensures a high operation speed without a significant increase in the element installation area. According to the present invention, a fixed program data memory cell can be fabricated without being restricted by the type (the volatile or nonvolatile type) of a programmable memory. Therefore, the fixed data program memory cell can be fabricated without depending upon the system configuration of an integrated circuit device for microcomputers. In other words, the present invention enables the fixed program data memory cell to be fabricated by utilizing the same circuit board on which the integrated circuits for microcomputers are provided, and without significantly increasing the element installation area on the circuit board.

FIG. 7 is a block circuit diagram illustrating a case where the present invention is applied to a integrated circuit device for a microcomputer. Referring to FIG. 7, the microcomputer integrated circuit device 25 comprises a fixed data cell array 22 located adjacent to an ordinary-function memory cell array 21. The device 25 is externally supplied with serial data SI and system clock CK and executes tests on the basis of the data programmed in the fixed data cell array 22. In other words, the fixed data cell array 22 stores fixed program data on the basis of which a series of tests are automatically executed. The tests include internal tests executed by CPU 23, and test results are written in a memory area 24. The test results can be determined by reading the contents of the data stored in the memory area 24. Since the peripheral circuits required for the memory cell array 21 and the fixed data cell array 22 are not prepared independently and used in common to them, the structure shown in FIG. 7 is effective in attaining a high-speed operation.

The present invention is not limited to the embodiments mentioned above, and enables a fixed data cell array to be arranged adjacent to any type of memory cell area, such as a mask ROM cell area, an EEPROM cell area, or a DRAM. In addition, the structure of the fixed program data cell can be realized in any manner other than those described above, as long as the structure retains data in a nonvolatile manner by means of the internal wirings and does not have adverse effects on the storage capacity of the bit lines.

As can be understood from the foregoing, the present invention provides a semiconductor integrated circuit which can reliably store fixed data and which has the following advantages:

First, the load capacity is constant without reference to the type of data stored in the fixed data cell. Since, therefore, the operation speed is constant, the data reading circuit can be easily optimized.

Second, since the memory cell area for fixed data and the programmable memory cell area are located adjacent to each other, the decoder and the reading circuits can be used in common to them, and the element installation area can be as narrow as possible.

Third, unlike the ordinary programmable memory cell, the memory cell area according to the present invention programs data by means of its structure (i.e., wirings). Thus, it can reliably serve as a nonvolatile memory used exclusively for reading out data.

Fourth, the array selector prevents the ordinary programmable memory cell from being accessed when the memory cell area according to the present invention is accessed. Thus, the ordinary programmable memory cell and the memory cell area according to the present invention operate without giving adverse effects on each other.

Fifth, the process of make up the memory cell area for fixed data does not require any addition or alteration.

Sixth, the data retained in the memory cell array according to the present invention is not erased or altered by an external electric operation.

What is claimed is:

1. A semiconductor integrated circuit device comprising:

a first memory cell array area which is programmable by electric control;

a second memory cell array area located adjacent to the first memory cell array area and using bit lines formed in the first memory cell array area, said second memory cell array area being pre-programmed as a nonvolatile memory by programming means different from that used for programming cells of the first memory cell array area, said second memory cell array area being incapable of being programmed by electric control;

a peripheral circuit used in common to the first and second memory cell array areas; and a memory cell array selector for selecting one of the first and second memory cell array areas only when the memory cell array selector receives a predetermined signal, wherein said first memory cell array area includes EPROM cells, and said second memory cell array area includes cells similar in structure to the EPROM cells, and wherein said nonvolatile memory of said second memory cell array area includes first and second data-retaining structures, said first data-retaining structure being a structure wherein a gate oxide film that forms a transistor is replaced by an oxide film thicker than the gate oxide film so as to deprive a transistor function from the first data-retaining structure, and said second data-retaining structure having a structure similar to a cell of the first memory cell array area.

2. A semiconductor integrated circuit device according to claim 1, wherein said second data-retaining structure of the second memory cell array area is applied with a potential difference which is smaller than a potential difference that enables data writing.

3. A semiconductor integrated circuit device comprising:

first memory means formed in a first memory cell array area and being programmable by electric control;

second memory means formed in a second memory cell array area located adjacent to the first memory cell array area, said first and second memory means using bit lines in common, said second memory means being incapable of being programmed by electric control;

a peripheral circuit used in common to the first and second memory means; and a memory array selector for exclusively selecting one of the first and second memory means only when said memory array selector receives a predetermined signal, wherein said first memory means includes EPROM cells, and said second memory means includes a normally-on first programming structure which is similar in structure to EPROM cells of the first memory means and which prohibits a data writing operation, and a second programming structure which includes an oxide film thicker than a gate oxide film included in the EPROM cells and from which a transistor function is deprived.

4. A semiconductor integrated circuit device comprising:

a first memory cell array area which is programmable by electric control;

a second memory cell array area located adjacent to the first memory cell array area and using bit lines formed in the first memory cell array area, said second memory cell array area being pre-programmed as a nonvolatile memory by programming means different from that used for programming cells of the first memory cell array area, said second memory cell array area being incapable of being programmed by electric control;

a peripheral circuit used in common to the first and second memory cell array areas; and a memory cell array selector for selecting one of the first and second memory cell array areas only when the memory cell array selector receives a predetermined signal, wherein said first memory cell array area includes RAM cells, and said second memory cell array area includes cells similar in structure to the RAM cells, and wherein said nonvolatile memory of the second memory cell array area includes first and second data-retaining structures which differ from each other in the manner in which internal wirings of the RAM cells are arranged.

5. A semiconductor integrated circuit device comprising:

first memory means formed in a first memory cell array area and being programmable by electric control;

second memory means formed in a second memory cell array area located adjacent to the first memory cell array area, said first and second memory means using bit lines in common, said second memory means being incapable of being programmed by electric control;

a peripheral circuit used in common to the first and second memory means; and a memory array selector for exclusively selecting one of the first and second memory means only when said memory array selector receives a predetermined signal, wherein said first memory means includes RAM cells, and wherein said second memory means permits data to be programmed in a nonvolatile manner by means of two data-retaining structures which differ from each other in the manner in which data storage nodes of the RAM cells are connected.

* * * * *